United States Patent
Hembree

(10) Patent No.: US 6,850,084 B2
(45) Date of Patent: Feb. 1, 2005

(54) ASSEMBLY FOR TESTING SILICON WAFERS WHICH HAVE A THROUGH-VIA

(75) Inventor: David R. Hembree, Boise, ID (US)

(73) Assignee: Micron Technology, Inc., Boise, ID (US)

(*) Notice: Subject to any disclaimer, the term of this patent is extended or adjusted under 35 U.S.C. 154(b) by 97 days.

(21) Appl. No.: 10/253,788

(22) Filed: Sep. 24, 2002

(65) Prior Publication Data

US 2003/0017687 A1 Jan. 23, 2003

Related U.S. Application Data

(62) Division of application No. 09/653,173, filed on Aug. 31, 2000, now Pat. No. 6,589,594.

(51) Int. Cl.[7] .............................................. G01R 31/26
(52) U.S. Cl. ................................... 324/765; 324/158.1
(58) Field of Search ............................... 324/755, 763, 324/765, 768–764, 158.1; 257/276, 688, 693, 698, 730, 749, 743–774, 777

(56) References Cited

U.S. PATENT DOCUMENTS

| | | | |
|---|---|---|---|
| 3,998,662 A | * 12/1976 | Anthony et al. ............... 117/40 |
| 4,348,253 A | 9/1982 | Subbarao et al. ............. 156/643 |
| 4,462,534 A | 7/1984 | Bitaillou et al. .......... 228/180 A |
| 4,830,264 A | 5/1989 | Bitaillou et al. .......... 228/180.2 |
| 5,088,639 A | 2/1992 | Gondotra et al. .......... 228/180.1 |
| 5,275,330 A | 1/1994 | Isaacs et al. .............. 228/180.2 |
| 5,454,161 A | 10/1995 | Beilin et al. .................... 29/852 |
| 5,571,375 A | 11/1996 | Izumi et al. ............... 156/646.1 |
| 5,583,073 A | 12/1996 | Lin et al. ...................... 439/183 |
| 5,744,285 A | 4/1998 | Felten et al. ................. 430/318 |
| 5,788,143 A | 8/1998 | Boyd et al. .................. 228/253 |
| 5,915,977 A | 6/1999 | Hembree et al. .............. 439/74 |
| 5,925,414 A | 7/1999 | Buechele et al. ............ 427/282 |
| 5,952,840 A | 9/1999 | Farnworth et al. ........... 324/755 |
| 5,973,396 A | * 10/1999 | Farnworth .................... 257/698 |
| 5,983,011 A | 11/1999 | Yamada et al. .......... 395/500.35 |
| 6,033,488 A | 3/2000 | An et al. ........................ 148/24 |
| 6,054,761 A | 4/2000 | McCormack et al. ........ 257/698 |
| 6,082,605 A | 7/2000 | Farnworth ...................... 228/33 |
| 6,095,398 A | 8/2000 | Takahashi et al. ............. 228/41 |
| 6,107,109 A | 8/2000 | Akram et al. .................. 438/15 |
| 6,114,187 A | 9/2000 | Hayes .......................... 438/106 |
| 6,114,240 A | 9/2000 | Akram et al. ................ 438/667 |
| 6,294,837 B1 | 9/2001 | Akram et al. ................ 257/774 |
| 6,400,172 B1 | 6/2002 | Akram et al. ................ 324/765 |
| 6,404,061 B1 | * 6/2002 | Hikita et al. ................. 257/777 |
| 6,489,675 B1 | * 12/2002 | Gruber et al. ............... 257/698 |

* cited by examiner

Primary Examiner—Minh N. Tang
(74) Attorney, Agent, or Firm—Whyte Hirschboeck Dudek SC

(57) ABSTRACT

A method for filling a via formed through a silicon wafer is disclosed. The method entails mounting the silicon wafer on a mounting substrate and depositing either molten or solid balls of a conductive material into the via. The deposited conductive material may be reflowed to provide electrical contact with other components on the surface of wafer.

14 Claims, 5 Drawing Sheets

ASSEMBLY FOR TESTING SILICON WAFERS WHICH HAVE A THROUGH-VIA

CROSS-REFERENCE TO RELATED APPLICATIONS

This application is a division of U.S. patent application Ser. No. 09/653,173, filed Aug. 31, 2000, now U.S. Pat. No. 6,589,594.

FIELD OF INVENTION

This invention relates generally to semiconductor wafer manufacture, and more particularly to methods for providing an electrical contact from one surface of a silicon wafer to the opposite surface, more particularly to methods for filling a through-via in a silicon wafer with a conductive material.

BACKGROUND OF THE INVENTION

A method is needed to make the most direct electrical connection from an interconnect's contact tip to the substrate upon which the interconnect is mounted. Currently, electrical continuity from an interconnect contact tip to the mounting substrate is by use of thin film aluminized traces that are wire bonded to the substrate. However, inductance, capacitance, and resistance increase with trace length and can degrade the electrical performance of the interconnect. Additionally, wire bond loop height must be kept at very low profile above the interconnect chip to prevent the wire bonds from touching the device under test.

A more direct and robust electrical contact from the interconnect contact tip to the mounting substrate would be to form a via in the vicinity of the interconnect contact tip through the full thickness of the wafer to the underside of the wafer. However, due to the thickness of the wafer, and/or the high aspect ratio of the via, conventional plating of the sides of such a "through-via" with metal is not practical, requiring other means of filling the via. A hallmark of this invention is to provide a process for filling a through-via that is formed through the thickness of a wafer with a conductive material.

SUMMARY OF THE INVENTION

The invention disclosed is a process for filling a through-via that is formed through the full thickness of a semiconductor wafer. In one embodiment, the process comprises the steps of: (i) providing a silicon wafer with at least one through-via formed through the thickness of the wafer; (ii) mounting the silicon wafer to a mounting substrate; (iii) positioning a solder jet nozzle in line with the through-via; and (iv) extruding a liquid conductive material through the solder jet nozzle such that the conductive material fills the through-via to form a conductive via.

In another embodiment, the process comprises the steps of: (i) providing a silicon wafer with at least one through-via; (ii) mounting the silicon wafer onto a surface of a mounting substrate, the mounting substrate surface having at least one cavity, wherein the silicon wafer is positioned with the through-via located in line with the cavity; (iii) positioning a solder jet nozzle in line with the through-via; and (iv) extruding a liquid conductive material through the solder jet nozzle such that the conductive material fills the through-via and the cavity in the mounting substrate to form a conductive via.

A further embodiment of the invention is a process comprising the steps of: (i) providing a silicon wafer with at least one through-via; (ii) mounting the silicon wafer onto a surface of a mounting substrate wherein the mounting substrate comprises a circuit substrate, the mounting substrate surface having at least one interconnect, wherein the silicon wafer is positioned such that the through-via is located in line with the interconnect; (iii) positioning a solder jet nozzle in line with the through-via; and (iv) extruding a liquid conductive material through the solder jet nozzle such that the conductive material fills the through-via in electrical contact with the interconnect.

Another embodiment of the invention is a process comprising the steps of: (i) providing a silicon wafer with at least one through-via; (ii) mounting the silicon wafer to a mounting substrate; (iii) providing a one or more conductive material balls; (iv) depositing the one or more conductive material balls in the through-via by means of a vacuum nozzle or tube, such that sufficient conductive material is deposited in the via to fill the via; and (v) reflowing the conductive material in the through-via to form a conductive via.

BRIEF DESCRIPTION OF THE DRAWINGS

Preferred embodiments of the invention are described below with reference to the following accompanying drawings, which are for illustrative purposes only. Throughout the following views, reference numerals will be used in the drawings, and the same reference numerals will be used throughout the several views and in the description to indicate same or like parts.

DETAILED DESCRIPTION OF THE PREFERRED EMBODIMENTS

In the following detailed description, references made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention.

The terms "wafer" or "substrate" used in the following description include any semiconductor-based structure having a silicon surface. Wafer and substrate are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when references made to a wafer or substrate in the following description, previous process steps may have been used to form regions or junctions in the base semiconductor structure or foundation.

The term "interconnect" refers to a device for making an electrical connection. Such devices include, inter alia, contacts, wires, electrically conductive pathways as well as more complicated structures.

Figure 1:
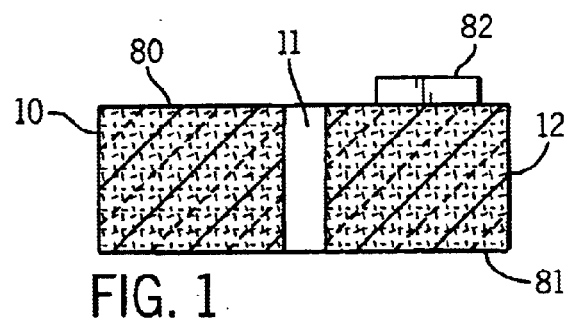
FIG. 1 is a cross-section of a conventional silicon wafer having a through-via formed therethrough.

FIG. 1 shows an exemplary silicon wafer 10, having a conventional thickness of about 28 mil, which can be about 8 to about 32 mil. In one example of a wafer suitable for use in this invention, an 8 in. diameter wafer having a thickness of 28 mil is fabricated and then background to a thickness of about 12,5 mil. The wafer includes a contact opening or via hole 11 which has been formed through the entire thickness of the wafer. Preferably, the via hole 11 has a diameter (width) of at least about 4 mil up to about 12 mil, preferably up to about 6 mil.

The wafer 10 comprises a first surface 80 and a second surface 81 which are generally opposed to each other. Typically, first surface 80 includes at least one interconnect 82 mounted thereon. A typical interconnect 82 is an interconnect for testing a semiconductor wafer. Such an interconnect 82 includes a substrate (not shown), conductive vias in the substrate (not shown), and first and second contacts (not shown) on either side of the conductive vias for making temporary electrical connectons between the wafer and test circuitry. More preferably interconnect 82 is in electrical contact with via hole 11. The electrical contact may be by any means but is typically by means of a metallized trace(s), preferably an aluminum or copper trace. Optionally, the second surface 81 of wafer 10 comprises metallized traces or pads (not shown) that act as capture pads to increase or enhance the conduction between the via 11 and the substrate 12.

The through-via can be formed in the wafer by laser machining, such as disclosed in copending U.S. patent application Ser. No. 09/475,546, filed Dec. 20, 1999, (now U.S. Pat. No. 6,400,172) incorporated herein by reference. The method of U.S. patent application Ser. No. 09/475,546 (now U.S. Pat. No. 6,400,172), generally stated, comprises laser machining conductive vias for interconnecting contacts on a component, using a laser beam that is focused to produce a desired via geometry. A via having an hour glass geometry (not shown) can be produced by focusing the laser beam proximate to a midpoint of the via. The hour glass geometry includes enlarged end portions having increased surface areas for depositing a conductive material into the via, and for forming contacts on the via. A via having an inwardly tapered geometry (not shown) can be produced by focusing the laser beam proximate to an exit point of the beam from the substrate. A via having an outwardly tapered geometry can be produced by focusing the laser beam proximate to an entry point of the beam into the substrate. A representative diameter of the via hole formed by the method of U.S. patent application Ser. No. 09/475,546 (now U.S. Pat. No. 6,400,172) is from about 10 $\mu$m to about 2 mils or greater. A representative fluence of the laser beam suitable for forming such a via hole through an about 28-mil thick, silicon wafer is from about 2 to about 10 watts/per opening at a pulse duration of about 20–25 ns, and at a repetition rate of up to several thousand per second. The wavelength of the laser beam can be a standard infrared or green wavelength (e.g., 1064 nm-532 nm), or any wavelength that will interact with and heat silicon.

Figure 2:
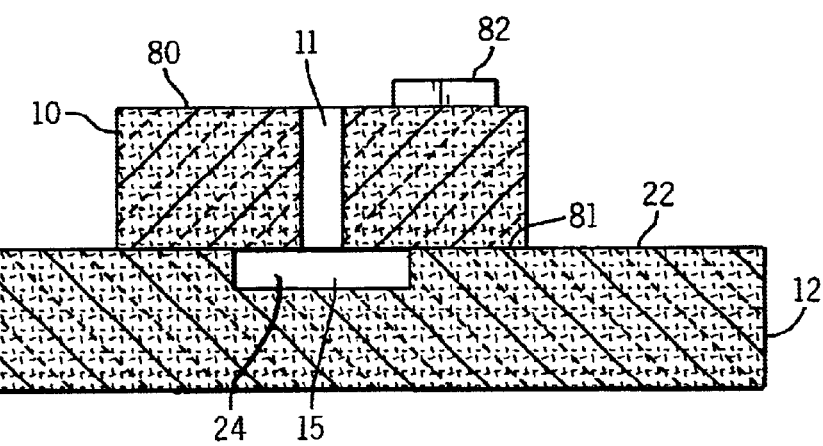
FIG. 2 is a cross-section of an assembly consisting of the silicon wafer of FIG. 1 mounted to a mounting substrate showing an optional cavity in the mounting substrate.

As shown in FIG. 2, the wafer 10 is mounted to a substrate that functions to hold the wafer in a specified position, such as mounting substrate 12. Mounting substrate 12 can be an assembly chuck to contain the solder within the via hole during the process of this invention, or could be a circuit substrate to which the traces of the silicon wafer 10 are to be electrically connected. Optionally, mounting substrate 12 may include a cavity 15 in the surface 22 over which the wafer is mounted, as shown in FIG. 2. When mounting substrate 12 includes a cavity 15, wafer 10 is mounted so that cavity 15 is in line with the through-via hole 11. The cavity 15 in mounting substrate 12 provides a containment area in which excess solder protrudes from silicon wafer 10 to allow the silicon wafer 10 to be surface mounted to a substrate. In other words, the presence of cavity 15 provides for the formation of a solder bump 24 on the second surface 81 of the silicon wafer 10.

Figure 3:
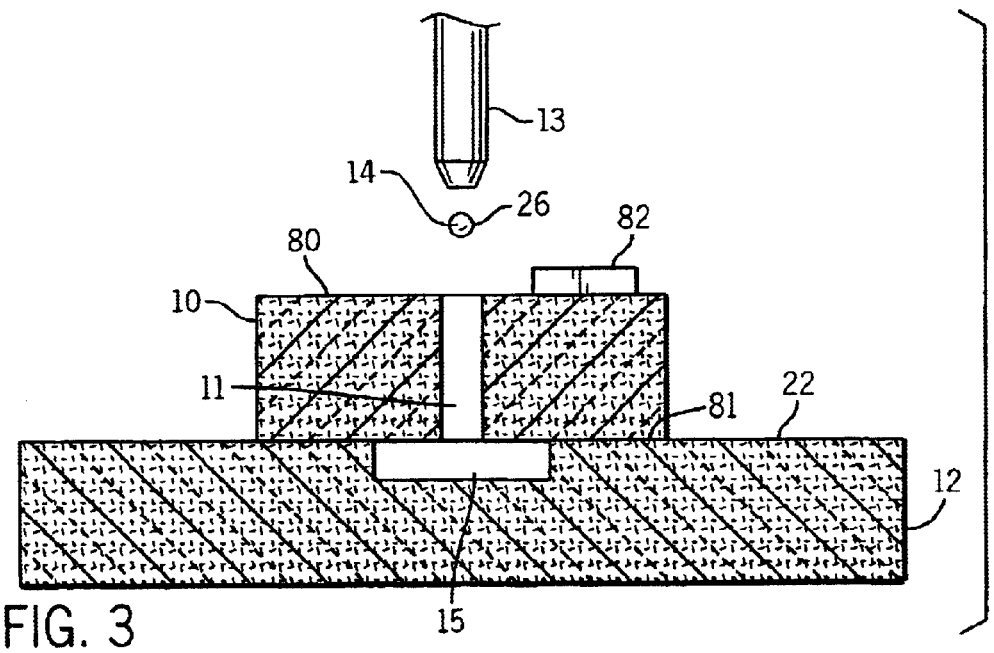
FIG. 3 shows the assembly of FIG. 2 at a processing step subsequent to that in FIG. 2.

Referring to FIG. 3, after silicon wafer 10 is mounted to mounting substrate 12, a device for depositing balls of liquid conductive material is positioned over the mounted wafer 10. Typically, the device for depositing balls of liquid conductive material comprises a solder jet nozzle 13. As shown in FIG. 3, the solder jet 13 is positioned in line with through-via hole 11. A molten conductive material 14 is then supplied to solder jet nozzle 13. The molten conductive material may be solder or an uncured conductive polymer, preferably solder.

The conductive material 14 is readily wettable to the substrate's metallized trace materials along with the metallized traces of the contact substrate. The term "readily wettable" means that the material makes good electrical and mechanical contact. The conductive material 14 can comprise any suitable readily wettable material, such as a solder alloy, typically a lead/tin (Pb/Sn), lead/tin/silver (Pb/Sn/Ag), or indium/tin (In/Sn) alloy. Example solder alloys include, inter alia, 95% Pb/5% Sn, 60% Pb/40% Sn, 63% In/37% Sn, or 62% Pb/36% Sn/2% Ag. Alternately, the conductive material 14 can comprise a relatively hard metal such as nickel, copper, beryllium copper, alloys of nickel, alloys of copper, alloys of beryllium copper, nickel-cobalt-iron alloys and iron-nickel alloys. In addition, the conductive material 14 can comprise a conductive polymer such as a metal-filled silicone, a carbon filled ink, or an isotropic or anisotropic adhesive in an uncured free-flowing state.

Figure 4:
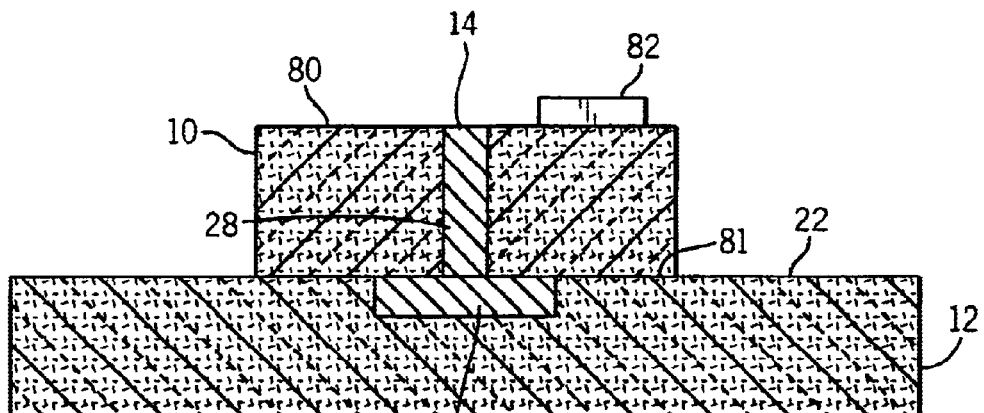
FIG. 4 shows the wafer of FIG. 2 at a processing step subsequent to that shown in FIG. 3.

Next, the molten conductive material is forced through solder jet nozzle 13 to form an extrudate. Preferably, the extrudate comprises small molten balls that are preferably about 25–125 $\mu$m in diameter. The solder jet nozzle 13 is aligned with through-via 11 and one or more molten balls 26 are deposited into through-via 11, as shown in FIG. 3. A sufficient quantity of molten conductive material 14 is extruded through solderjet nozzle 13 and into via 11 to at least fill through-via 11 In the case where mounting substrate 12 comprises a cavity 15, the quantity of molten conductive material extruded through solder jet nozzle 13 is sufficient to fill both the cavity 15 and the through-via 11, as shown in FIG. 4. The conductive material deposited into through-via 11 will eventually solidify as it cools to form filled via 28 and solder bump 24.

A preferred method of providing the balls 26 of molten conductive material 14 is through the use of solder jet technology modified from ink jet printing technology. One suitable example of this is solder jet technology available from MicroFab which is based on piezoelectric demand-mode ink-jet printing technology (i.e., piezoelectric pressure inducer) and is capable of placing molten solder droplets, 25–125 micrometers in diameter, at rates up to 400/sec (not shown). Operating temperatures of 220° C. are normally used, and temperatures up to 300° C. have been feasible.

Another suitable solder jet device is disclosed in U.S. Pat. No. 6,082,605, incorporated herein by reference. The solder jet apparatus disclosed in U.S. Pat. No. 6,082,605 (not shown) is a continuous-mode solder jet that includes a blanking system and a raster scan system. In general, the solder droplets are formed from melted metal held in liquid reserve. A temperature controller is connected to the liquid metal reservoir to maintain the liquid metal held in the reservoir at a desired temperature that facilitates optimum droplet formation and release. The solder droplets are formed by the application of the driving pressure at a sufficient vibration force. The driving pressure is be provided by a pressure inducer, which is comprised of a piezoelectric crystal driven by a tuning frequency sufficient to cause pressure to build up in the liquid metal reservoir. The mechanical vibration is generated by a vibrator, which comprises a second piezoelectric crystal driven by another tuning frequency, which causes the liquid metal reservoir to vibrate. Once the solder droplets are formed, the vibration releases the droplets from the liquid metal reservoir and the force of gravity draws the droplets down on a predictable velocity. The solder jet nozzle 13 is opened and closed by means of a solenoid.

Optionally, the conductive material filling in via 28 can be reflowed to wet any connections located on the first surface 80 or the second surface 81 of the wafer, such as interconnect 82.

The deposition of the balls of conductive material 14, and optional reflow of the conductive material, is preferably performed in an inert atmosphere such as nitrogen, especially when the conductive material 14 comprises solder. Such an inert environment reduces the formation of metal oxides, some of which can increase the electrical resistance of the interconnects. Alternatively, if the deposition or reflow process is conducted in an ambient atmosphere, a shielding gas, such as nitrogen, can be directed around the extruding nozzle. The molten solder balls 14 would then be shielded from possible oxidation as they travel from the nozzle into the via.

Figure 5:
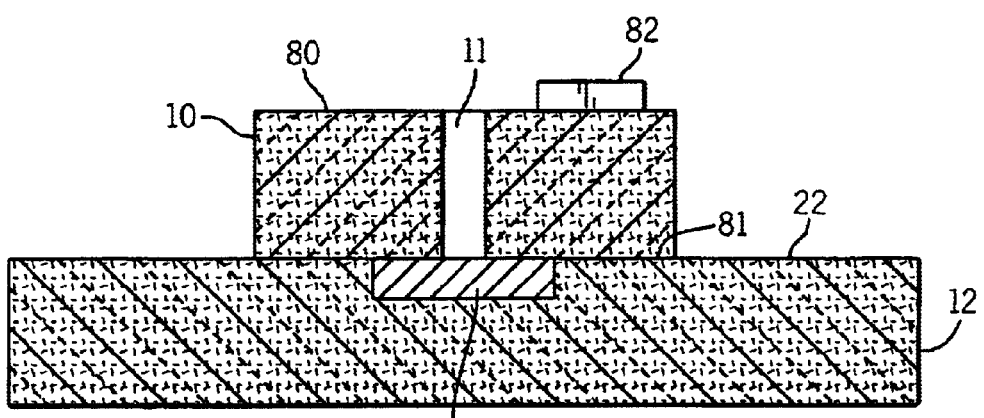
FIG. 5 is a cross sectional view of an assembly comprising the silicon wafer of FIG. 1 mounted on a mounting substrate showing an optional contact pad on the mounting substrate.

In another embodiment, mounting substrate 12 can comprise a circuit substrate (not shown) to which interconnect 82 is to be electrically connected, and which comprises at least one metal contact pad 16, as shown in FIG. 5. Metal pad 16 may comprise a conductive metal, such as copper or gold. Conveniently, metal pad 16 comprises gold to enhance solderability to the pad. In the case where mounting substrate 12 comprises a copper contact pad 16, silicon wafer 10 is preferably mounted so that copper contact pad 16 is in line with through-via hole 11.

In a preferred embodiment, the circuit substrate of mounting substrate 12 comprises the testing circuitry of a testing apparatus. The testing apparatus can be, for example, a conventional wafer probe handler, or a probe tester, modified for use with filled via 28. Wafer probe handlers, and associated test equipment, are commercially available, for example, from Electroglass, Advantest, Teradyne, Megatest, Hewlett-Packard, and others.

Figure 6:
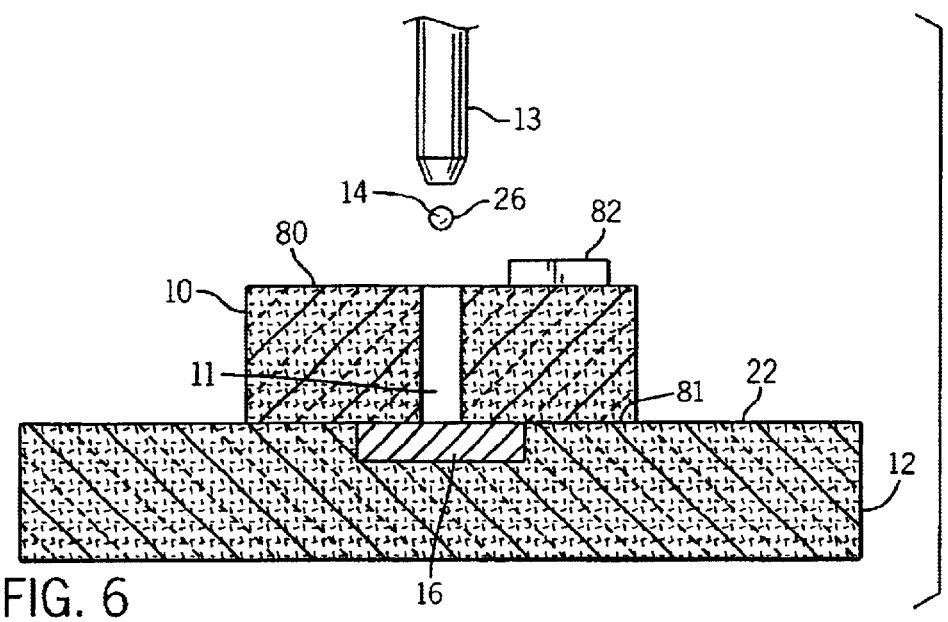
FIG. 6 shows the assembly of FIG. 5 at a processing step subsequent to FIG. 5.

Next, solder jet 13 deposits balls 26 of molten conductive material 14 are deposited into via hole 11, as shown in FIG. 6. The balls 26 of molten conductive material 14 are deposited as previously described.

Figure 7:
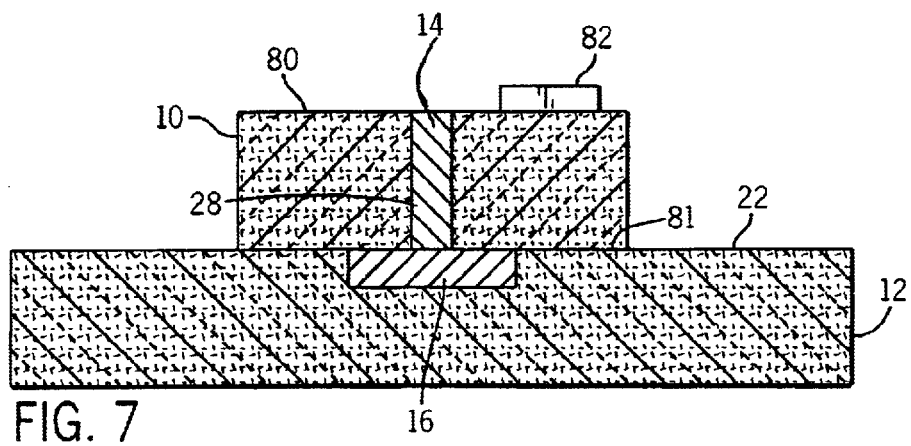
FIG. 7 shows the assembly of FIG. 5 at a processing step subsequent to that shown in FIG. 6.

The molten conductive material 14 is then allowed to cool, resulting in a filled via 28 as shown in FIG. 7.

Optionally, the conductive material 14 within filled via 28 can be reflowed to wet the top and bottom connections such as interconnect 82.

In another embodiment of the method of the invention, a silicon wafer 10 is provided having a through-via hole 11, as shown in FIG. 1. The wafer 10 is mounted onto mounting substrate 12 as shown in FIG. 2. The mounting substrate 12 can be, for example, an assembly chuck to contain the solder during fabrication, or a circuit substrate to which traces on the wafer 10 are to be electrically connected.

Optionally, the mounting substrate 12 can include one or more cavities 15 in the surface 22 onto which the wafer 10 as mounted. In this option, wafer 10 is mounted such that the cavity 15 in mounting substrate 12 is in line with through-via hole 11. Optionally, cavity 15 in mounting substrate 12 may be partially filled with conductive material 14 prior to mounting the wafer 10 to substrate 12. This option advantageously reduces the quantity of conductive material 14 that must be deposited by nozzle 13.

Next, one or more discrete portions 30, preferably in the shape of balls, of a meltable conductive material 14 are provided. The conductive material 14 may be solder or a conductive polymer, preferably solder, as previously described.

Figure 8:
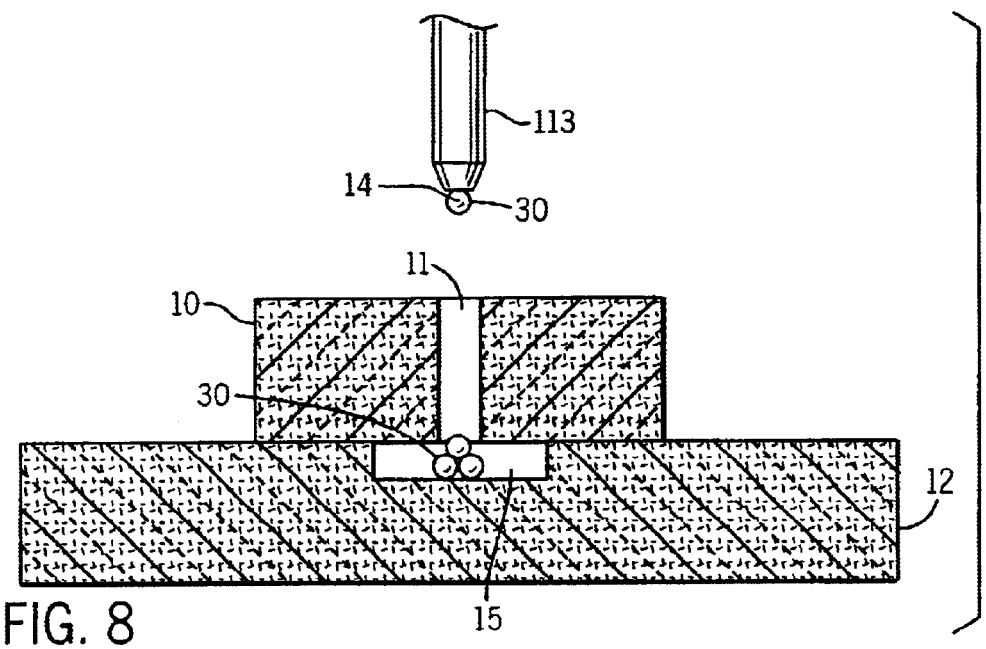
FIG. 8 shows the assembly of FIG. 2 at a processing step subsequent to FIG. 2.

Next, a vacuum nozzle or tube 113 of a vacuum device is used to transfer a ball 30 of conductive material 14 to the opening of through-via hole 11, as shown in FIG. 8. Using the vacuum nozzle or tube 113, the ball 30 of conductive material 14 into via hole 11. The deposit may be made either by placing, dropping or pressing the ball 30 into via hole 11. These steps are continued until sufficient balls 30 of conductive material 14 are deposited into via hole 11 to provide enough conductive material 14 to fill via hole 11. In the case where mounting substrate 12 comprises a cavity 15, the process is continued until sufficient balls 30 are deposited into via hole 11 to provide enough conductive material to at least fill cavity 15 and via hole 11. As stated above, advantageously cavity 15 is partially filled with conductive material 14 prior to mounting wafer 10 to substrate 12.

The vacuum nozzle or tube 113 is preferably a component of a vacuum pick-and-place system. Vacuum pick-and-place systems have been used to deposit solder balls in the semi conducting industry and any such system may be suitable for use in this invention. One such method is disclosed in U.S. Pat. No. 5,788,143, the disclosure of which is incorporated by reference herein, which discloses an apparatus comprising a reservoir for containing solder particles, means for producing a vacuum, a pick-up head having a connection for the vacuum producing member and a plurality of apertures smaller in size than the solder particles, a control member causing the head to transport the particles from the reservoir, a member for aligning the apertures and member for controlling the vacuum to the pick-up head. Another system is taught in U.S. Pat. No. 5,088,639, the disclosure of which is incorporated by reference herein, which discloses a multi-point soldering process in which a vacuum pick-up tool attached to a robot gripper and simultaneously picks up a plurality of solder balls from an oscillating reservoir. A vision system determines that each pickup element has a solder ball, then the balls are dipped in sticky flux and deposited onto a circuitboard and interconnection locations by releasing the vacuum. Furthermore, U.S. Pat. No. 4,462,534, the disclosure of which is incorporated herein by reference, describes a suction device, which suctions up moving solder balls and contains a vibrating ball and dispenses the balls to a previously fluxed substrate.

Next, heat is applied to the wafer 10 mounted on the mounting substrate 12 in order to melt the balls 30 of conductive material 14 and cause the conductive material 14 to reflow, thereby forming filled via 28 and wetting any contact metalization on the upper surface 80 and lower surface 81 of the wafer 10, such as interconnect 82 as shown in FIG. 4.

Figure 9:
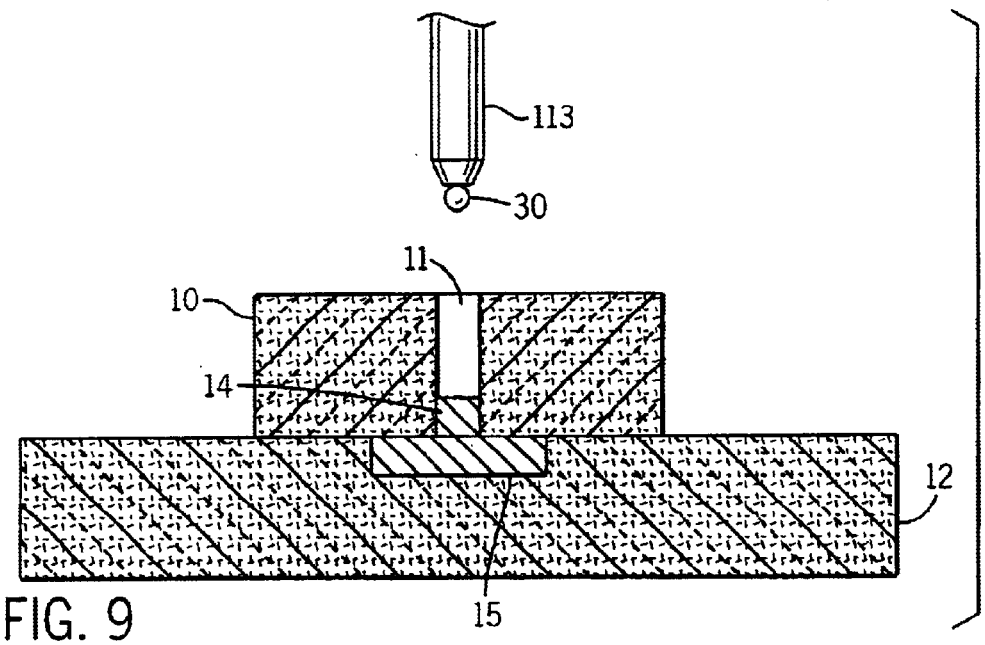
FIG. 9 shows the assembly of FIG. 8, and a vacuum nozzle depositing balls of conducting material in an embodiment of the method of the invention, whereby the silicon wafer is heated while the balls of the conductive material are deposited.

Optionally, as shown in FIG. 9, the silicon wafer 10 may be heated while the balls 30 of conductive material 14 are deposited into via hole 11, thereby melting and reflowing the conductive material 14 as the balls 30 are deposited.

Optionally, the melting and reflow of conductive material 14 occurs under an ambient atmosphere or under a shielding gas as described for embodiment one. This option is particularly advantageous when the conductive material 14 comprises solder.

In another embodiment of the method of the invention, mounting substrate 12 comprises a circuit substrate (not shown) to which the interconnect 82 of silicon wafer 10 is to be electrically connected, and comprises at least one copper pad 16 as shown in FIG. 5. Wafer 10 is mounted to mounting substrate 12 such that the copper pad 16 is in line with through-via hole 11.

Next, one or more discrete particles, preferably in the form of balls 30 of a meltable conductive material 14 is provided. The conductive material 14 may be solder or a conductive polymer as previously described. Balls 30 typically have a diameter of about 25 to about 125 microns.

Figure 10:
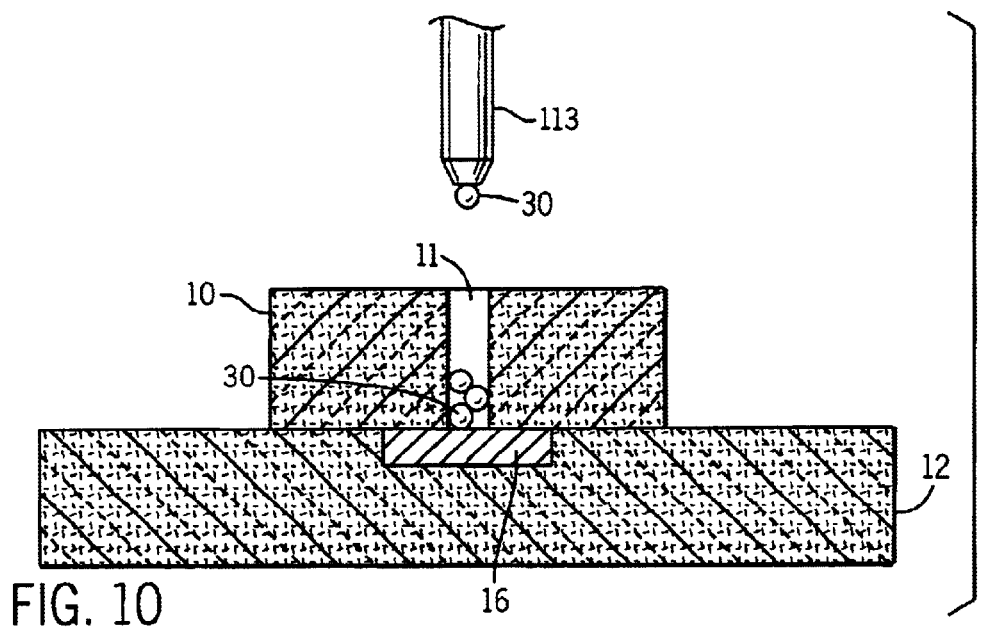
FIG. 10 shows the assembly of FIG. 5 at a processing step subsequent to FIG. 5.

Next, a vacuum nozzle or tube 113 of a vacuum device, such as the pick-and-place systems described earlier, is used to transfer a ball 30 of conductive material 14 to the opening of through-via 11 as shown in FIG. 10. Vacuum nozzle or tube 113 is used to deposit the ball 30 of conductive material 14 into via hole 11. The deposit may be made either by placing, dropping or pressing the ball into via hole 11. These steps are continued until sufficient balls 30 of conductive material 14 are deposited into via hole 11 to provide enough conductive material 14 to fill via hole 11.

Next, heat is applied to the wafer 10 mounted on the mounting substrate 12 in order to melt the balls 30 of conductive material 14 and cause the conductive material 14 to reflow thereby forming filled via 28 and wetting any contact metalization such as interconnect 82 on the upper surface 80 and lower surface 81 of the wafer as shown in FIG. 4.

Figure 11:
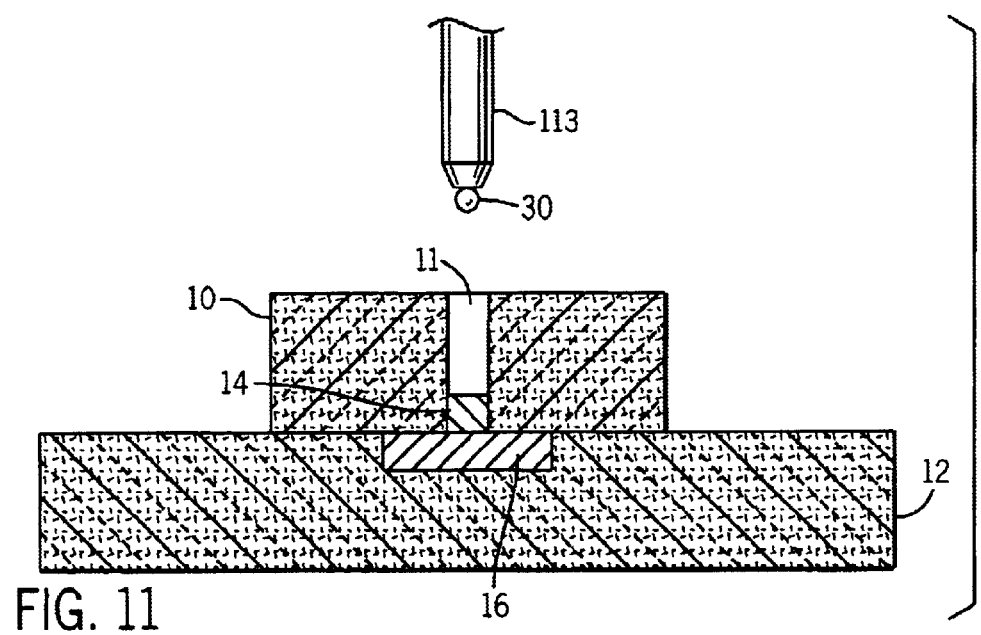
FIG. 11 shows the assembly of FIG. 10, and a vacuum nozzle depositing balls of conductive material in an embodiment of the method of the invention whereby the wafer is heated while depositing of the balls of conducting material.

Optionally, as shown in FIG. 11, the silicon wafer 10 may be heated while the balls 30 of conductive material 14 are deposited into via hole 11, thereby melting and reflowing the conductive material 14 as the balls 30 are deposited.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. An assembly for testing silicon wafers comprising:
a silicon wafer comprising a first surface and a second surface generally opposed to each other, the first surface comprising at least one interconnect, the wafer having at least one through-via extending from the first surface to the second surface, the through-via being completely filled with a conductive material, wherein the interconnect is electrically connected to the through-via;
a testing circuit comprising at least one contact pad; wherein the wafer is mounted on the testing circuit such that the second surface of the wafer abuts the surface of the testing circuit having the contact pad wherein the contact pad is an electrical connection with the conductive material of the through-via.

2. The testing apparatus of claim 1 wherein the wafer is at least about 6 mil thick.

3. The assembly of claim 1 wherein the interconnect and the through-via are electrically connected by means of a metallized trace.

4. The assembly of claim 3 wherein the metallized trace is an aluminum or copper trace.

5. The assembly of claim 1 wherein the second surface of the wafer further comprises metallized traces or pads that act as capture pads.

6. The assembly of claim 1 wherein the conductive material is selected from the group consisting of lead/tin solder, lead/tin/silver solder, indium/tin solder, nickel, copper, beryllium, copper, alloys of nickel, allows of copper, alloys of beryllium copper, nickel-cobalt-iron alloys, iron-nickel alloys, metal-filled silicone, carbon filled ink and isotropic or anisotropic adhesive.

7. The assembly of claim 1 wherein the through-via is at least about 4 mil wide.

8. An assembly for testing silicon wafers comprising:
a silicon wafer comprising a first surface and a second surface generally opposed to each other, the first surface comprising at least one interconnect, the wafer having at least one through-via extending from the first surface to the second surface, the through-via being completely filled with a conductive material, wherein the interconnect is electrically connected to the through-via;
a wafer probe handler comprising at least one contact pad; wherein the wafer is mounted on the wafer probe handler such that the second surface of the wafer abuts the surface of the wafer probe handler having the contact pad wherein the contact pad is an electrical connection with the conductive material of the through-via.

9. The testing apparatus of claim 8 wherein the wafer is at least about 6 mil thick.

10. The assembly of claim 8 wherein the interconnect and the through-via are electrically connected by means of a metallized trace.

11. The assembly of claim 10 wherein the metallized trace is an aluminum or copper trace.

12. The assembly of claim 8 wherein the second surface of the wafer further comprises metallized traces or pads that act as capture pads.

13. The assembly of claim 8 wherein the conductive material is selected from the group consisting of lead/tin solder, lead/tin/silver solder, indium/tin solder, nickel, copper, beryllium, copper, alloys of nickel, allows of copper, alloys of beryllium copper, nickel-cobalt-iron alloys, iron-nickel alloys, metal-filled silicone, carbon filled ink and isotropic or anistropic adhesive.

14. The assembly of claim 8 wherein the through-via is at least about 4 mil wide.

* * * * *